US008350742B2

(12) United States Patent
Gerez et al.

(10) Patent No.: US 8,350,742 B2
(45) Date of Patent: Jan. 8, 2013

(54) METHOD FOR DIGITIZING AN ANALOGUE SIGNAL WITH AN ANALOGUE-DIGITAL CONVERTER OF DETERMINED SHANNON FREQUENCY

(75) Inventors: Valerio Gerez, Yerres (FR); Julien Christian Pascal Griffaton, Paris (FR)

(73) Assignee: Snecma, Paris (FR)

( * ) Notice: Subject to any disclaimer, the term of this patent is extended or adjusted under 35 U.S.C. 154(b) by 127 days.

(21) Appl. No.: 13/030,546

(22) Filed: Feb. 18, 2011

(65) Prior Publication Data

US 2011/0199249 A1 Aug. 18, 2011

(30) Foreign Application Priority Data

Feb. 18, 2010 (FR) ...................................... 10 51192

(51) Int. Cl.
*H03M 1/12* (2006.01)

(52) U.S. Cl. ...................................... 341/155; 700/191

(58) Field of Classification Search .................... None
See application file for complete search history.

(56) References Cited

U.S. PATENT DOCUMENTS

| 6,031,879 | A * | 2/2000 | Pace et al. ...................... 375/316 |
| 7,304,597 | B1 * | 12/2007 | LaMarche ...................... 341/155 |
| 2011/0173009 | A1 * | 7/2011 | Fuchs et al. ................... 704/500 |

OTHER PUBLICATIONS

Rachid et al., A Novel Reconfigurable Alias Interference Cancellation Technique for A-to-D Conversion, 2011 IEEE International Symposium on Circuits and Systems (ISCAS), Publication Year: 2011, pp. 1656-1659 IEEE Conference Publications.*
Pace et al., Use of the Symmetrical Number System in Resolving Single-Frequency Undersampling Aliases, IEEE Transactions on Signal Processing, vol. 45, No. 5, May 1997 pp. 1153-1160.*
Richard E. Leino, "Use of the Symmetrical Number System in Resolving Undersampling Aliases", Naval Postgraduate School, XP002603216, Sep. 1, 1996, 11 pages.
French Preliminary Search Report issued Nov. 5, 2010, in French 1051192, filed Feb. 18, 2010 (with English Translation of Category of Documents).

* cited by examiner

*Primary Examiner* — Howard Williams
(74) *Attorney, Agent, or Firm* — Oblon, Spivak, McClelland, Maier & Neustadt, L.L.P.

(57) ABSTRACT

A method for forming a global spectrum (Sg) of an analogue signal (A) to be digitized, in which:
  the analogue signal (A) is sampled with a first analogue-digital converter (21, 22) of determined Shannon frequency (Fs) so as to obtain an aliasing spectrum (Sr), the analogue signal (A) not having been previously filtered by an anti-aliasing filter;
  a base spectrum (Sb) is subtracted from the aliasing spectrum (Sr) so as to obtain an aliased spectrum (Sre), the base spectrum (Sb) corresponding to an aliasing-free spectrum of the said analogue signal;
  a dealiased spectrum (Sd) is computed on the basis of the aliased spectrum (Sre) as a function of the Shannon frequency (Fs) of the converter (21, 22);
  the base spectrum (Sb) is concatenated with the dealiased spectrum (Sde) so as to form the global spectrum (Sg) of the analogue signal (A).

8 Claims, 4 Drawing Sheets

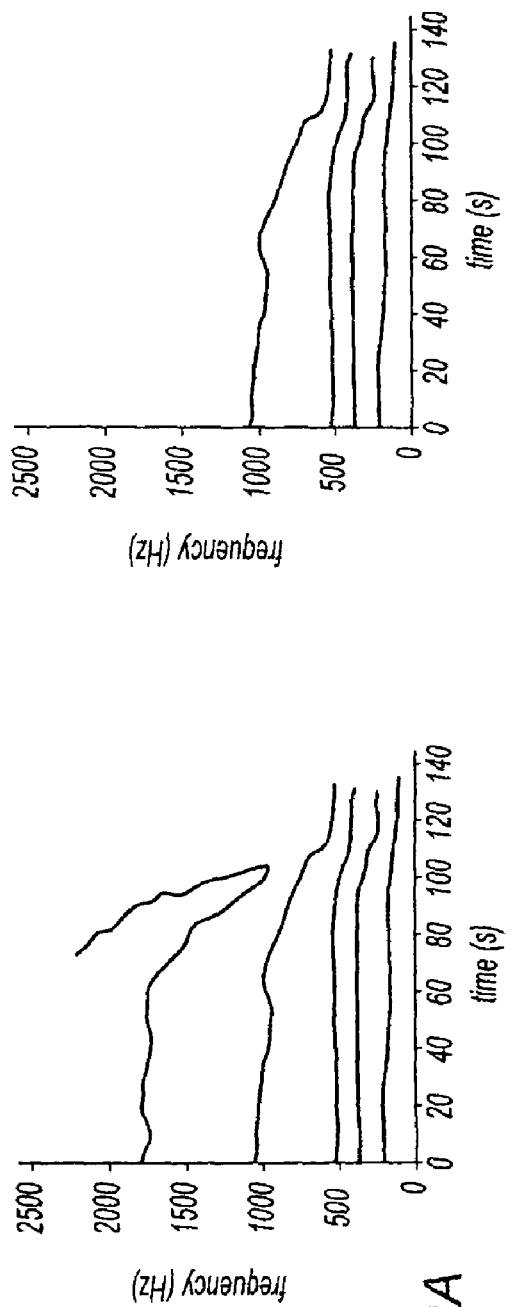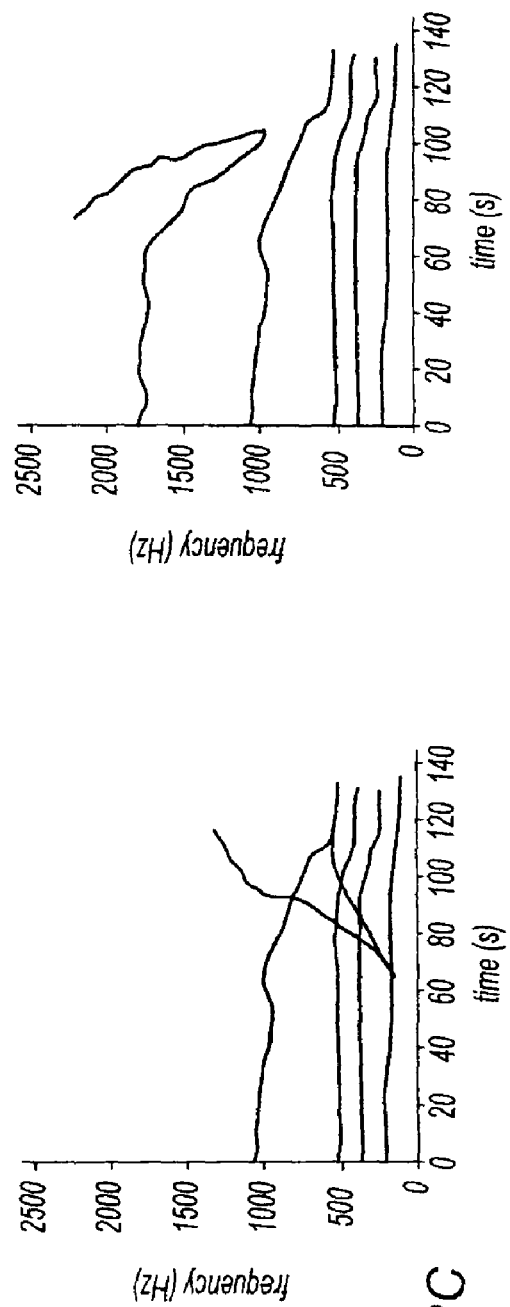

METHOD FOR DIGITIZING AN ANALOGUE SIGNAL WITH AN ANALOGUE-DIGITAL CONVERTER OF DETERMINED SHANNON FREQUENCY

The invention relates to the field of signal processing and, more particularly, to the digital acquisition of analogue signals on the basis of an analogue-digital converter.

In a conventional manner, an analogue-digital converter is designed to sample an analogue signal, obtained by a sensor, as a digital signal at a determined sampling frequency. A Shannon frequency corresponding to half the sampling frequency is associated with its sampling frequency. For any specialist in signal processing, it is known that it is not possible to measure an analogue signal whose frequency is greater than the Shannon frequency of the converter since this would induce an aliasing of the signal and therefore an impairment or "pollution" of the conversion.

In the field of aeronautics, contemporary turboengines comprise analogue-digital converters. Such a converter takes the form of a computer, known to the person skilled in the art under the designation ACMS for "Aircraft Condition Monitoring System", measuring the "slow" parameters of the turboengine, that is to say parameters whose frequency of variation is less than 5 Hz such as for example the temperature or parameters for regulating the fuel (fuel flow rate, fuel pressure, etc.).

The "slow" parameters are acquired by sensors in an analogue manner and then sampled, at a low sampling frequency, in the vicinity of 30 Hz, to obtain a digital signal. The computer possesses a Shannon frequency equal to 15 Hz and is unsuitable for measuring a signal whose characteristic frequency is greater than 15 Hz.

It is known through application FR2892516 from the company SNECMA that pulsed fuel injection may induce a resonance of the rotor shaft whose characteristic frequency is greater than 15 Hz.

An immediate solution for measuring the resonant frequency would be to increase the converter sampling frequency, in such a way that its Shannon frequency is greater than the resonant frequency. Such a solution would make it necessary to modify all the computers of contemporary turboengines, which would be very expensive.

Furthermore, such a computer is intrinsically unsuitable for measuring signals whose frequency is greater than its Shannon frequency on account of the fact that it does not comprise any low-pass filter designed to remove, from the analogue signal to be sampled, the frequencies greater than the Shannon frequency in order to avoid any aliasing.

Thus, the person skilled in the art is not prompted to seek relevant information in a signal comprising aliasing, such a signal being considered to be an improper signal.

The invention is aimed at digitizing an analogue signal while exceeding the limit imposed by Shannon's theorem for an analogue-digital converter whose sampling frequency is not sufficiently high, that is to say whose Shannon frequency is below the frequency of the signals to be measured.

For this purpose, the invention relates to a method for forming a global spectrum of an analogue signal to be digitized, in which:
the analogue signal is sampled with a first analogue-digital converter of determined Shannon frequency so as to obtain an aliasing spectrum, the analogue signal not having been previously filtered by an anti-aliasing filter;
a base spectrum is subtracted from the aliasing spectrum so as to obtain an aliased spectrum, the base spectrum corresponding to an aliasing-free spectrum of the said analogue signal;
a dealiased spectrum is computed on the basis of the aliased spectrum as a function of the Shannon frequency of the converter;
the base spectrum is concatenated with the dealiased spectrum so as to form the global spectrum of the analogue signal.

Thus, the limits imposed by Shannon's theorem are exceeded so as to allow the formation of a global spectrum of an analogue signal with an analogue-digital converter which is, at first sight, unsuitable.

This makes it possible, in an advantageous manner, to be able to directly identify a resonant frequency with a computer whose Shannon frequency is insufficient.

According to a first aspect of the invention, an anti-aliasing filter is applied to the said analogue signal at the Shannon frequency and the said filtered analogue signal is sampled with a second analogue-digital converter of the same Shannon frequency so as to obtain the base spectrum.

The base spectrum can thus be computed in real time with a second converter. This makes it possible to form a base spectrum which corresponds to the aliasing spectrum from which the aliasing has been deleted.

Preferably, the analogue signal is sampled over a first time window with a first analogue-digital converter of determined Shannon frequency so as to obtain the aliasing spectrum;
an anti-aliasing filter is applied to the said analogue signal at the Shannon frequency over a second time window;
the said filtered analogue signal is sampled with a second analogue-digital converter of the same Shannon frequency so as to obtain the base spectrum.

The digitization of the signal over time windows advantageously makes it possible to limit the number of computations and to thus employ converters of limited power.

According to a first variant, the first time window and the second time window are one and the same time window.

According to a second variant, the second time window follows the first time window, the first and second time windows preferably being adjoining.

In contradistinction to a "continuous" formation method in which one and the same signal is digitized twice (once with an anti-aliasing filter and once without the filter), "alternated" processing makes it possible to limit the number of digitization steps.

According to another aspect of the invention, for a plurality of reference analogue signals of the same type as the analogue signal to be digitized:
an anti-aliasing filter is applied to the said reference analogue signals at the Shannon frequency;
the said reference analogue signals are sampled with a second analogue-digital converter of the same Shannon frequency as the first analogue-digital converter so as to obtain the reference spectra of the reference analogue signals;
a mean of the reference spectra is computed so as to form the base spectrum.

The base spectrum is thus formed in a manner preliminary to the formation of the global spectrum.

Preferably, the analogue signal to be digitized and the plurality of reference analogue signals are measurements of an operating parameter of one and the same turboengine. The base spectrum is thus an individual spectrum of the turboengine which is specific to the said turboengine and corresponds to its individual signature.

Alternatively, the analogue signal to be digitized is a measurement of an operating parameter of a determined turboengine and the plurality of reference analogue signals are measurements of an operating parameter of turboengines of the same family as the said determined turboengine. The base spectrum is thus a family spectrum of the family of engines which corresponds to the family signature of the family of the turboengine.

Thus, the global spectrum is formed rapidly on the basis of a reference base spectrum computed for the said turboengine or for the said family of turboengines.

Preferably, the analogue signal to be digitized is a measurement of a turboengine fuel regulating parameter so as to be able to determine a resonant frequency of a rotor shaft of the said turboengine.

The invention will be better understood with the aid of the appended drawing in which:

FIG. 2a is a spectrogram obtained on the basis of a series of spectra of the same type as that of FIG. 1a;

FIG. 2b is a spectrogram obtained on the basis of a series of spectra of the same type as that of FIG. 1b;

FIG. 2c is a spectrogram obtained on the basis of a series of spectra of the same type as that of FIG. 1c;

FIG. 2d is a spectrogram obtained on the basis of a series of spectra of the same type as that of FIG. 1f;

Figure 3A:
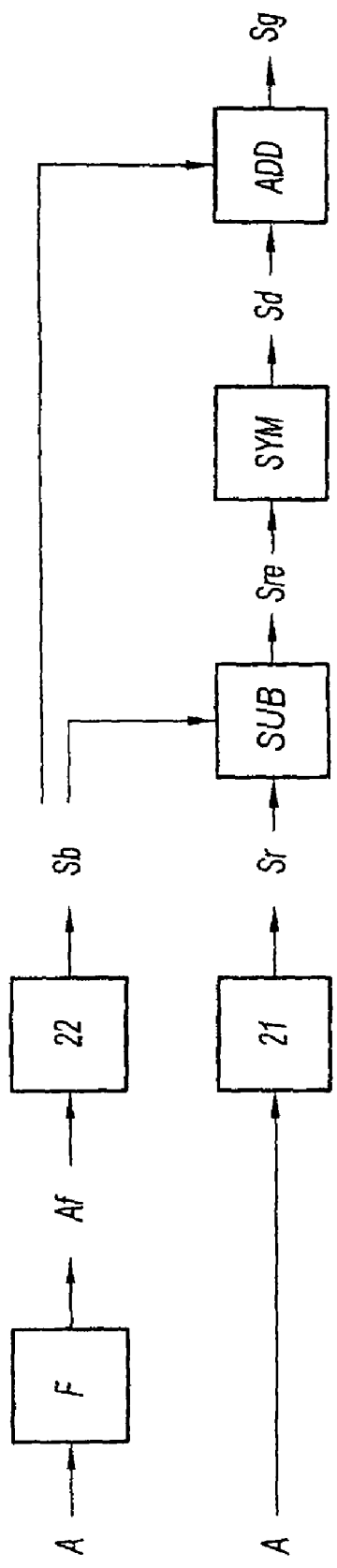
FIG. 3a is a diagram of the steps of the method for forming a global spectrum of an analogue signal according to a first implementation of the invention with two converters carrying out sampling in parallel.
Figure 3B:
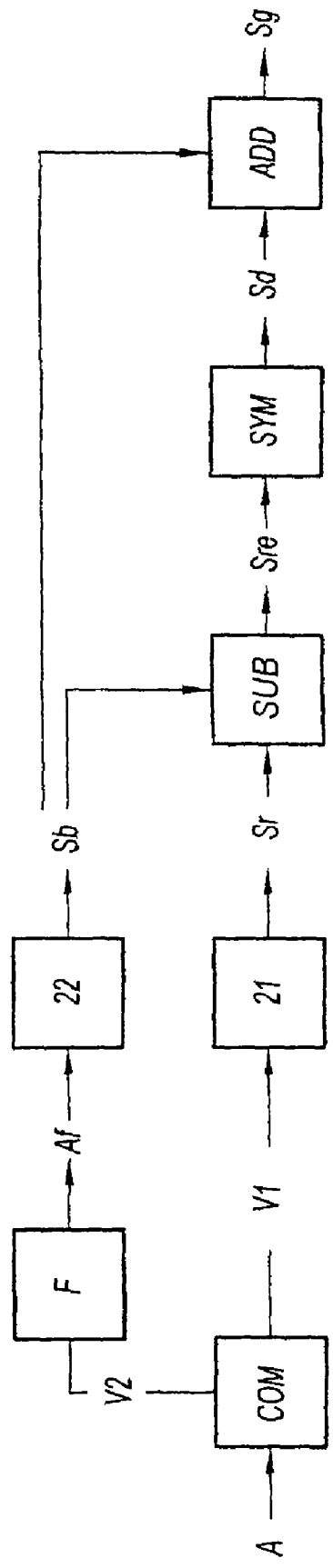
FIG. 3b is a diagram of the steps of the method according to a second implementation of the invention with two converters carrying out alternated sampling.
Figure 3C:
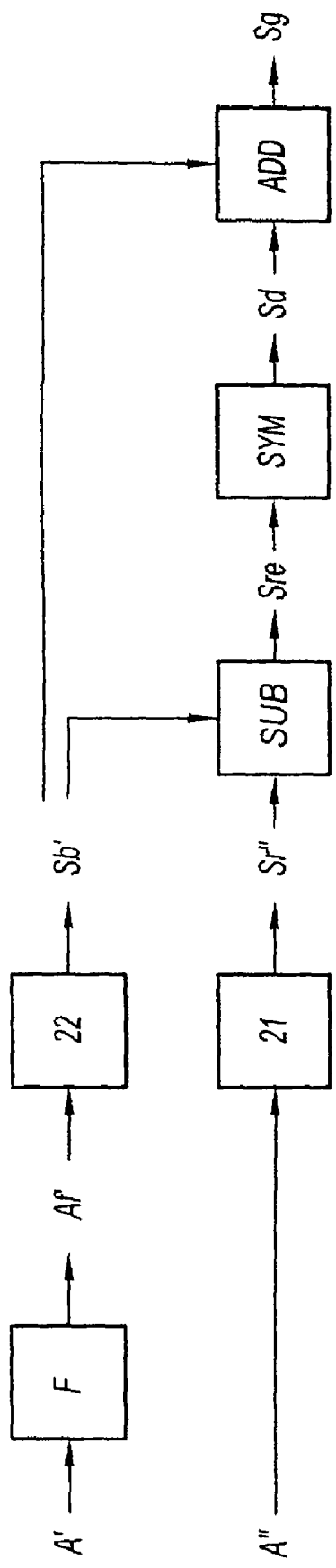
Figure 3D:
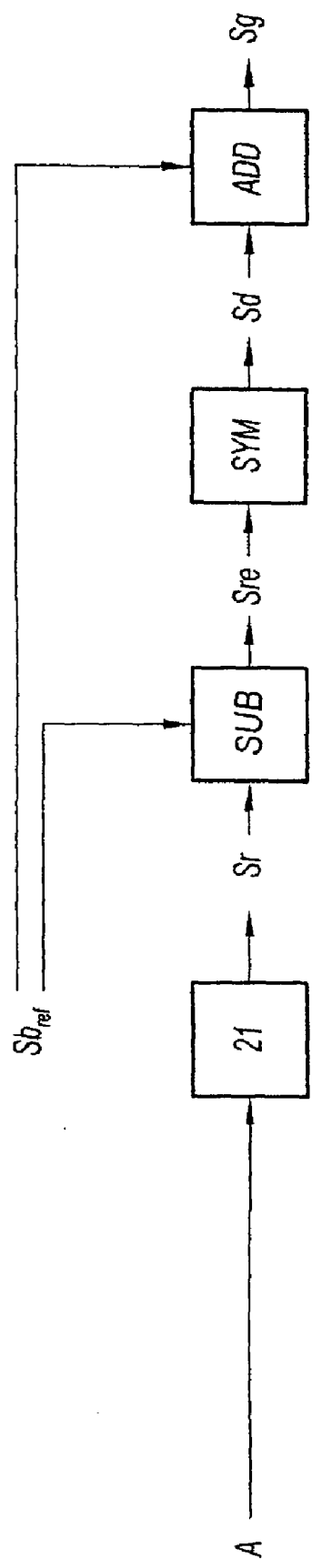

FIG. 3c is a diagram of the steps of the method according to a third implementation of the invention with two converters processing analogue signals arising from two different analogue sensors; and FIG. 3d is a diagram of the steps of the method according to a fourth implementation of the invention for a signal of an operating parameter of a turboengine, the global spectrum being obtained on the basis of a base spectrum defined on the basis of a plurality of reference spectra.

The invention will be described for the formation of a global spectrum of an analogue signal of a turboengine fuel regulating parameter so as to obtain a digitized signal of the said parameter. A fuel regulating parameter is an operating parameter of the turboengine.

Of more particular interest is a fuel flow rate on account of the fact that the fuel is traditionally injected into a turboengine in a pulsed manner and may induce a resonance of a rotor shaft of the turboengine as indicated in patent application FR2892516 from the company SNECMA.

In a conventional manner, a rotor shaft possesses a natural angular frequency which corresponds to its first torsional mode. The angular frequency depends on the geometry of the rotor shaft and is therefore known for the rotor shaft of the said turboengine. The phenomenon of resonance, designated resonance subsequently, arises during excitation of the shaft of the rotor by an excitation signal whose frequency corresponds to the angular frequency of the shaft, this frequency of the excitation signal being designated resonant frequency. Stated otherwise, if the rotor shaft is excited by a signal at the resonant frequency, the rotor shaft resonates, thereby generating noise and fatigue of the rotor shaft.

Although a fuel parameter varies in a slow manner globally, that is to say globally its frequency is less than 5 Hz, locally it can comprise fast frequencies, greater than 5 Hz, for example lying between 20 Hz and 50 Hz. These fast frequencies termed resonant frequencies or "fuel pulsing" must be measured so as to preclude any phenomenon of resonance of the rotor shaft and thus avoid the generation of noise in the cabin of the aircraft on which the turboengine is mounted or fatigue of the rotor shaft.

By way of example, the operating parameter in question is a fuel flow rate. It goes without saying that the fuel pressure or a degree of opening of a fuel intake flap could also be suitable.

In a conventional manner, a turboengine resonance detection system comprises a digitization system comprising a computer designed to sample an analogue signal of a fuel parameter of the turboengine measured by a sensor of the turboengine. In a conventional manner, the computer possesses a sampling frequency Fe and a Shannon frequency Fs defined as half the sampling frequency Fe. The computer does not comprise any anti-aliasing filter.

By way of example, the computer possesses a sampling frequency Fe of 50 Hz and, consequently, a Shannon frequency Fs of 25 Hz. On account of the aliasing, the resonant frequencies Fr are not visible but are aliased in the digital signal formed by the computer as represented in FIG. 1c.

Figure 1A:
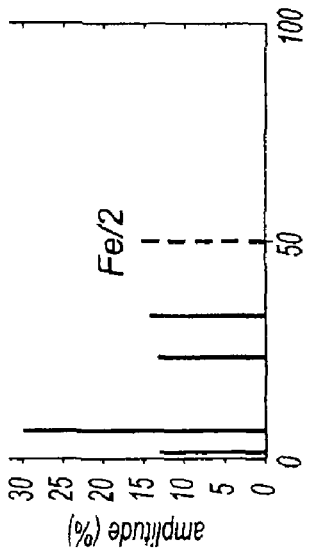
FIG. 1a is a spectrum of an analogue signal sampled by an analogue-digital converter with a sampling frequency of greater than 100 Hz.

Indeed, with reference to FIG. 1a, if the computer possessed a sufficiently high sampling frequency, for example 100 Hz, its Shannon frequency would be 50 Hz and the resonant frequencies, lying between 20 Hz and 50 Hz, would be measured/converted correctly, that is to say without aliasing. As mentioned previously, such a solution is not achievable since it would involve modifying all the computers fitted to the turboengines, this not being conceivable.

The invention is therefore aimed at obtaining a global spectrum of the fuel parameter identical to that of FIG. 1a, but with an existing computer whose sampling frequency is insufficient.

First Implementation of the Invention—Sampling in Parallel

According to a first implementation of the invention, the fuel flow rate parameter is measured first of all by means of a sensor of the turboengine to obtain an analogue signal A. This analogue signal is processed by a digitization system which comprises a first analogue-digital converter 21 and a second analogue-digital converter 22.

With reference to FIG. 3A, by means of the first analogue-digital converter 21 of Shannon frequency equal to 25 Hz, an aliasing spectrum Sr of the analogue signal A is formed, the analogue signal A not having been previously filtered by an anti-aliasing filter F. These steps correspond to the lower branch of the diagram of FIG. 3A. The aliasing spectrum Sr obtained corresponds to the spectrum of FIG. 1c.

Still with reference to FIG. 3A, the analogue signal A is filtered with an anti-aliasing filter F centred on the Shannon frequency of the first analogue-digital converter 21 to obtain a filtered analogue signal Af. The anti-aliasing filter F, a low-pass filter for example, is centred with a cutoff frequency of 25 Hz and eliminates the signals whose frequency is greater than 25 Hz.

Figure 1B:
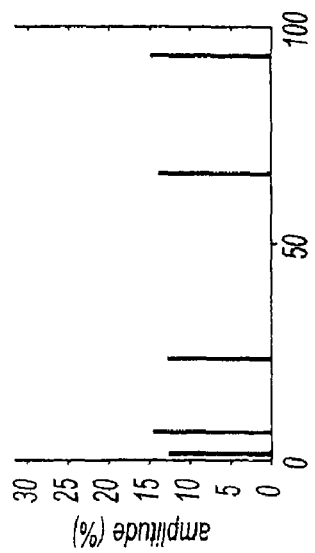
FIG. 1 is a first spectrum of the said analogue signal sampled by a first analogue-digital converter with a sampling frequency equal to 50 Hz, the analogue signal having been previously filtered by an anti-aliasing filter at the Shannon frequency of 25 Hz.
FIG. 1c is a second spectrum of the said analogue signal sampled by a second analogue-digital converter with a sampling frequency equal to 50 Hz, the analogue signal not having been previously filtered by an anti-aliasing filter.
FIG. 1d is an aliased spectrum of the analogue signal computed on the basis of the first and second spectra of FIGS. 1b and 1c.
FIG. 1e is a dealiased spectrum of the analogue signal computed on the basis of the aliased spectrum of the analogue signal of FIG. 1d.
FIG. 1f is a global spectrum of the analogue signal formed on the basis of the dealiased spectrum of FIG. 1e and of the first spectrum of FIG. 1b.
Figure 1C:
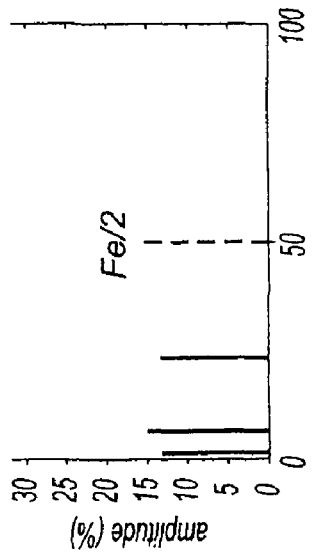

Next, by means of the second analogue-digital converter 22 of Shannon frequency equal to that of the first converter 21, a spectrum of the filtered analogue signal Af is formed, termed the base spectrum Sb. These steps correspond to the upper branch of the diagram of FIG. 3A. The base spectrum Sb obtained corresponds to FIG. 1b.

Figure 1D:
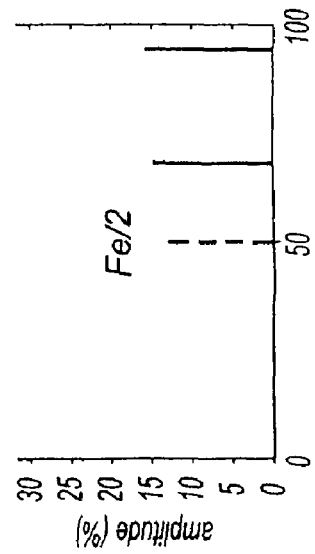

The digitization system comprises, furthermore, a subtractor module SUB, designed to compute an aliased spectrum Sre by subtracting the base spectrum Sb from the aliasing spectrum Sr. The aliased spectrum Sre obtained corresponds to FIG. 1d.

Figure 1E:
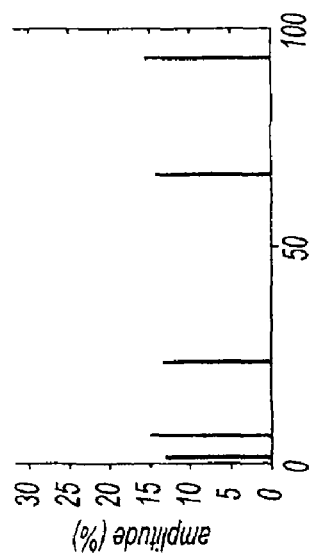

A dealiased spectrum Sd is thereafter obtained through symmetry of the aliased spectrum Sre with respect to the Shannon frequency of the converters 21, 22. For this purpose, the digitization system comprises a symmetry module SYM designed to perform this symmetry. The dealiased spectrum Sd obtained corresponds to FIG. 1e.

Stated otherwise, for an aliased frequency Fre, its dealiased frequency Fde is computed as a function of the sampling frequency Fe of the converters 21, 22 according to the following formula: Fde=Fe−Fre (or Fde=2Fs−Fre)

Figure 1F:
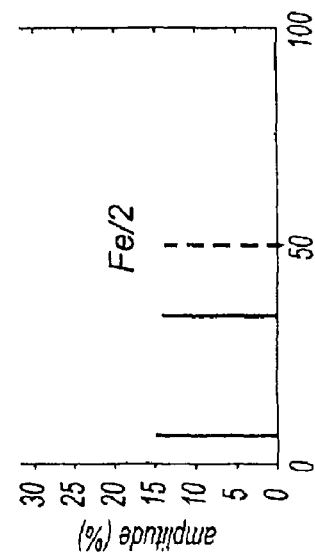

A concatenation module ADD, integrated into the digitization system, computes a global spectrum Sg by concatenating the dealiased spectrum Sd with or adding it to the base spectrum Sb. The global spectrum Sg obtained corresponds to FIG. 1f.

By virtue of these steps, the signals whose frequency is greater than that of Fs in the aliased spectrum Sre have been measured. Next, the said frequencies have been dealiased so as to complete the base spectrum Sb in order to form a global spectrum Sg.

Thus, with a digitization system of low sampling frequency, less than 50 Hz, a global spectrum Sg that is described as "quasi-perfect" has been obtained. Indeed, the global spectrum Sg obtained, represented in FIG. 1f, corresponds approximately to the perfect spectrum Sp, represented in FIG. 1a, obtained with a digitization system of high sampling frequency, greater than 50 Hz, here 100 Hz. Stated otherwise, the method according to the invention makes it possible to exceed the limit imposed by Shannon's theorem.

By virtue of the invention, it is therefore possible to analyse the global spectrum Sg obtained so as to search for a resonant frequency of the rotor shaft. The global spectrum Sg obtained is advantageously similar to that which would have been obtained with an analogue-digital converter of higher sampling frequency. Here, a doubled sampling frequency is simulated.

The invention has been presented here with two analogue-digital converters, but it goes without saying that the invention also applies to a single analogue-digital converter comprising two distinct inputs making it possible to carry out parallel processing.

Second Implementation of the Invention—Alternated Sampling

A second mode of implementation of the invention is described with reference to FIG. 3B. The references used to describe the elements of identical, equivalent or similar structure or function to those of the elements of FIG. 3A are the same, to simplify the description. Moreover, the whole of the description of the mode of implementation of FIG. 3A is not repeated, this description being applied to the elements of FIG. 3B when there are no incompatibilities. Only the appreciable, structural and functional differences are described.

Thus, with reference to FIG. 3B, the digitization system comprises a switch COM designed to transmit the analogue signal A in an alternated manner:
  to the first analogue-digital converter 21 so as to form an aliasing spectrum Sr of the analogue signal A, the analogue signal A not having been previously filtered by an anti-aliasing filter F; and
  to the anti-aliasing filter F so as to obtain a filtered analogue signal, and then, to the second analogue-digital converter 22 so as to form the base spectrum Sb.

Stated otherwise, the analogue signal A is sliced into successive time windows, one time window out of two being filtered by the anti-aliasing filter F, all the time windows being thereafter digitized by the analogue-digital converters 21, 22.

Preferably, the successive time windows are all digitized by one and the same analogue-digital converter. By way of example, if the signal is sliced into three successive time windows, the first window is filtered by the anti-aliasing filter and then digitized by the single converter. Thereafter, the second window is not filtered but digitized by the single converter. Finally, the third window is filtered by the anti-aliasing filter and then digitized by the single converter. Such an embodiment advantageously makes it possible to limit the passband of the converter.

Thus, one and the same analogue-digital converter alternately processes a filtered and unfiltered analogue signal. The number of arithmetic operations is therefore limited, contemporary converters with a single analogue input being suitable for implementing such steps.

Preferably, the duration of the time windows is computed in such a way that the variations of the analogue signal A between two successive time windows are negligible. In this example, the duration of the time window is of the order of 0.1 to 1 second.

Thus, the aliased spectrum Sre and the dealiased spectrum Sde which are computed are very close to the spectra which would have been obtained by parallel processing which requires greater computational power.

Third Implementation of the Invention—Parallel Sampling of Two Analogue Signals

A third mode of implementation of the invention is described with reference to FIG. 3C. The references used to describe the elements of identical, equivalent or similar structure or function to those of the elements of FIG. 3A are the same, to simplify the description. Moreover, the whole of the description of the mode of implementation of FIG. 3A is not repeated, this description being applied to the elements of FIG. 3C when there are no incompatibilities. Only the appreciable, structural and functional differences are described.

Thus, with reference to FIG. 3C, the measurement of a fuel parameter is carried out with the aid of two distinct sensors (not represented) which measure respectively a first analogue signal A' and a second analogue signal A".

The relevance of this third embodiment is to do with the fact that the measured analogue signals are very similar to one another and represent one and the same measurement of a fuel parameter, here a fuel flow rate.

The two analogue signals A', A" are regarded as one and the same analogue signal A and the steps of the first embodiment such as represented in FIG. 3A are implemented.

By means of the first analogue-digital converter 21 of Shannon frequency equal to 25 Hz, an aliasing spectrum Sr"

of the first analogue signal A″ is formed, the first analogue signal A″ not having been previously filtered by an anti-aliasing filter F. In parallel, the second analogue signal A′ is filtered with an anti-aliasing filter F to obtain a filtered analogue signal Af′. Next, by means of the second analogue-digital converter 22 of Shannon frequency equal to that of the first converter 21, a base spectrum Sb′ is formed. In a similar manner to previously, the subtractor module SUB computes an aliased spectrum Sre by subtracting the aliasing spectrum Sr″ from the base spectrum Sb′. The dealiased spectrum Sd is thereafter obtained through symmetry of the aliased spectrum Sre with respect to the Shannon frequency of the converters 21, 22. The concatenation module ADD computes a global spectrum Sg by concatenating the dealiased spectrum Sd with the base spectrum Sb′.

Thus, with two different sensors measuring respectively one and the same fuel parameter, it is possible to obtain a global spectrum of the said fuel parameter.

The invention has been presented here with two analogue-digital converters but it goes without saying that the invention also applies to a single analogue-digital converter comprising two distinct inputs making it possible to carry out parallel processing.

Alternatively, the system can also comprise a switch COM which makes it possible alternately to dispatch the first filtered analogue signal Af′ and the second analogue signal A″ to a single converter with a single analogue input in a similar manner to the second embodiment.

Fourth Implementation of the Invention—Reference Base Spectrum

A fourth mode of implementation of the invention is described with reference to FIG. 3D. The references used to describe the elements of identical, equivalent or similar structure or function to those of the elements of FIG. 3A are the same, to simplify the description. Moreover, the whole of the description of the mode of implementation of FIG. 3A is not repeated, this description being applied to the elements of FIG. 3D when there are no incompatibilities. Only the appreciable, structural and functional differences are described.

In a manner similar to the first embodiment, the fuel flow rate parameter is measured first of all by means of a sensor of the turboengine to obtain an analogue signal A.

With reference to FIG. 3D, by means of an onboard analogue-digital converter, an aliasing spectrum Sr of the analogue signal A is formed, the analogue signal A not having been previously filtered by an anti-aliasing filter F.

Thus, the aliasing spectrum Sr corresponds to the spectrum that is obtained on contemporary computers which do not comprise any anti-aliasing filter.

To obtain a global spectrum Sg, a subtractor module SUB, integrated into the digitization system, computes an aliased spectrum Sre by subtracting a base spectrum Sb from the aliasing spectrum Sr.

In contradistinction to the first embodiment in which the base spectrum is formed on the basis of an analogue signal measured by the turboengine, the base spectrum Sb is here a reference base spectrum $Sb_{ref}$ corresponding to a mean of several previously computed base spectra.

Stated otherwise, the reference base spectrum Sbref is predetermined and does not need to be computed by the digitization system. Thus, it suffices solely to modify the existing computers in a software manner to obtain a global spectrum Sg, without adding an anti-aliasing filter.

Advantageously, a known reference base spectrum $Sb_{ref}$ which is stored in the digitization system is available for each parameter of the engine.

According to a first alternative, the reference base spectrum $Sb_{ref}$ corresponds to a mean of several base spectra computed previously for the said turboengine. Stated otherwise, an individual reference base spectrum has been computed for the said turboengine. This spectrum is subsequently designated individual spectrum.

To form the individual spectrum, a plurality of base spectra is formed as indicated previously for several flight phases (startup, cruising, etc.) of a turboengine.

To form each of the base spectra for the various flight phases of the engine, an analogue signal measuring the parameter of the turboengine is filtered with an anti-aliasing filter to obtain a filtered analogue signal. Next, by means of an analogue-digital converter of Shannon frequency equal to that of the onboard converter, a base spectrum is formed.

After obtaining the plurality of base spectra, the mean of the base spectra is computed so as to form the individual spectrum. Preferably, a filtering of the plurality of base spectra is carried out so as to delete the base spectra which are far removed from the other base spectra (variance computation, etc.). Stated otherwise, the plurality of base spectra is cleaned up so as to form a cleaned individual spectrum which is representative of the said turboengine. According to this first alternative, the global spectrum Sg is formed on the basis of a pre-computed individual spectrum so as to limit the computation steps in flight while having a made-to-measure global spectrum on account of the fact that the individual spectrum has been formed on the basis of measurements on the said turboengine.

According to a second alternative, the reference base spectrum $Sb_{ref}$ corresponds to a mean of several individual spectra computed previously for several turboengines of one and the same family. Stated otherwise, a family reference base spectrum has been computed for the said family of turboengines. This spectrum is subsequently designated family spectrum.

To form the family spectrum, a plurality of individual spectra is formed as indicated previously for several flight phases (startup, cruising, etc.) of a family of turboengines.

After obtaining the plurality of individual spectra, the mean of the individual spectra is computed so as to form the family spectrum. Preferably, a filtering of the plurality of individual spectra is carried out so as to delete the individual spectra which are far removed from the other individual spectra (variance computation, etc.). Stated otherwise, the plurality of individual spectra is cleaned up so as to form a cleaned family spectrum which is representative of the operating parameter of the said family of turboengines.

In contradistinction to the first alternative, this makes it possible to dispense with forming an individual spectrum for each new engine. All the computations are carried out on the basis of a family spectrum computed previously for one and the same family of turboengines. This makes it possible to simplify the formation of a global spectrum for an operating parameter of a turboengine, doing so without modifying the existing computers.

The invention has been presented here with a computer whose sampling frequency is 50 Hz but it goes without saying that the invention applies to a computer whose frequency is equal to 30 Hz or any other frequency.

The invention claimed is:

1. Method for forming a global spectrum of an analogue signal to be digitized, in which:
   the analogue signal is sampled with a first analogue-digital converter of determined Shannon frequency, so as to obtain an aliasing spectrum, the analogue signal not having been previously filtered by an anti-aliasing filter;

a base spectrum is subtracted from the aliasing spectrum so as to obtain an aliased spectrum, the base spectrum corresponding to an aliasing-free spectrum of the said analogue signal;

a dealiased spectrum is computed on the basis of the aliased spectrum as a function of the Shannon frequency of the converter;

the base spectrum is concatenated with the dealiased spectrum so as to form the global spectrum of the analogue signal; method in which:

for a plurality of reference analogue signals of the same type as the analogue signal to be digitized:

an anti-aliasing filter is applied to the said reference analogue signals at the Shannon frequency;

the said reference analogue signals are sampled with a second analogue-digital converter of the same Shannon frequency as the first analogue-digital converter so as to obtain the reference spectra of the reference analogue signals;

a mean of the reference spectra is computed so as to form the base spectrum.

2. Method according to claim 1, in which:

an anti-aliasing filter is applied to the said analogue signal at the Shannon frequency;

the said filtered analogue signal is sampled with a second analogue-digital converter of the same Shannon frequency so as to obtain the base spectrum.

3. Method according to claim 1, in which:

the analogue signal is sampled over a first time window with a first analogue-digital converter of determined Shannon frequency so as to obtain the aliasing spectrum;

an anti-aliasing filter is applied to the said analogue signal at the Shannon frequency over a second time window;

the said filtered analogue signal is sampled with a second analogue-digital converter of the same Shannon frequency so as to obtain the base spectrum.

4. Method according to claim 3, in which the first time window and the second time window are one and the same time window.

5. Method according to claim 3, in which the second time window follows the first time window, the first and second time windows preferably being adjoining.

6. Method according to claim 1, in which the analogue signal to be digitized and the plurality of reference analogue signals are measurements of an operating parameter of one and the same turboengine.

7. Method according to claim 1, in which the analogue signal to be digitized is a measurement of an operating parameter of a determined turboengine and the plurality of reference analogue signals are measurements of an operating parameter of turboengines of the same family as the said determined turboengine.

8. Method according to claim 1, in which the analogue signal to be digitized is a measurement of a turboengine fuel regulating parameter.

* * * * *